US012584945B2

(12) United States Patent
Inoue et al.

(10) Patent No.: US 12,584,945 B2
(45) Date of Patent: Mar. 24, 2026

(54) CONTACT PROBE AND SOCKET FOR ELECTRICAL COMPONENT TESTING

(71) Applicant: Enplas Corporation, Kawaguchi (JP)

(72) Inventors: Yuta Inoue, Kawaguchi (JP);
Yasushige Komatsu, Kawaguchi (JP);
Yasuyuki Sakamoto, Kawaguchi (JP)

(73) Assignee: ENPLAS CORPORATION,
Kawaguchi (JP)

( * ) Notice: Subject to any disclaimer, the term of this patent is extended or adjusted under 35 U.S.C. 154(b) by 212 days.

(21) Appl. No.: 18/624,735

(22) Filed: Apr. 2, 2024

(65) Prior Publication Data

US 2024/0329082 A1 Oct. 3, 2024

(30) Foreign Application Priority Data

Apr. 3, 2023 (CN) .......................... 202310347423.X

(51) Int. Cl.
G01R 1/067 (2006.01)

(52) U.S. Cl.
CPC ..... G01R 1/06733 (2013.01); G01R 1/06722 (2013.01)

(58) Field of Classification Search
CPC ............ G01R 1/06733; G01R 1/06722; G01R 1/0408
See application file for complete search history.

(56) References Cited

U.S. PATENT DOCUMENTS

2006/0267601 A1* 11/2006 Farris ................. G01R 1/06794
324/754.05
2022/0317153 A1* 10/2022 Yuta ................... G01R 1/06722

* cited by examiner

*Primary Examiner* — G.M. A Hyder
(74) *Attorney, Agent, or Firm* — Jason A. Smith; Shumaker, Loop & Kendrick, LLP

(57) ABSTRACT

Embodiments of the present application provide a contact probe and a socket for electrical component testing. The contact probe includes a tubular structure within which a receiving cavity is formed, wherein a contact part for contacting a terminal of a first electrical component is provided at a first end of the tubular structure; a spring provided in the receiving cavity, wherein a coil outer diameter of a first end of the spring is greater than a coil outer diameter of a middle of the spring; a plunger connected to the tubular structure in a slidable manner, wherein a first end of the plunger is provided with a spring positioning structure, which comprises a transition part and an eccentric structure body connected to the transition part; wherein the eccentric structure body is arranged offset from a central axis of the plunger, and one end of the eccentric structure body is sheathed by the first end of the spring, one end of the transition part connected to the eccentric structure body is provided with an inclined surface, so that the spring is not contacted with the transition part when the spring is compressed; a second end of the plunger protrudes from a second end of the tubular structure.

12 Claims, 15 Drawing Sheets

<u>10</u>

300

300

3122
3121
3111
312
311

300

<u>300</u>

CONTACT PROBE AND SOCKET FOR ELECTRICAL COMPONENT TESTING

TECHNICAL FIELD

The present application relates to the technical field of electrical component testing, in particular to a contact probe and a socket for electrical component testing.

BACKGROUND

In a production process of an electrical component such as an IC (Integrated Circuit) package, a relevant testing device is required to be used to test its electrical performance. This testing device typically comprises a socket electrically connected to another electrical component, such as a wiring substrate.

A socket in the related art comprises a socket body and a contact probe, wherein a receiving part capable of receiving a first electrical component is formed on the socket body, and a probe storage hole is also formed in the socket body, and the contact probe is stored in the probe storage hole. During electrical testing, the first electrical component is placed in the receiving part, with one end of the contact probe in contact with the terminal of the first electrical component and the other end in contact with the second electrical component, thereby establishing an electrical connection between the first and second electrical components.

In the related art, a contact probe generally comprises a tubular structure, a spring, and a plunger. A receiving cavity is formed within the tubular structure, and the first end of the tubular structure is configured to contact the terminal of the first electrical component. The spring is arranged in the receiving cavity, and the first end of the plunger is arranged with a protrusion against which the spring abuts, and the second end of the plunger protrudes from the second end of the tubular structure.

In the related art, the distance between the side wall of the plunger and the inner wall of the tubular structure is relatively small, which not only imposes higher machining accuracy requirements on the tubular structure and the plunger, but also leads to greater difficulty in assembling the plunger and tubular structure, resulting in lower productivity. In order to improve the productivity, the distance between the side wall of the plunger and the inner wall of the tubular structure can be increased. However, it has been verified by the experiments of the inventors that, if the distance between the side wall of the plunger and the inner wall of the tubular structure is increased, during electrical testing, one end of the spring in contact with the plunger is easily separated from the protrusion of the plunger after the spring is compressed, which will reduce the energized contact load of the contact probe and reduce the reliability of electrical testing.

SUMMARY

The purpose of the embodiment of the present application is to provide a contact probe and a socket for electrical component testing, to improve the reliability of electrical testing. The specific technical solutions are as follows.

An embodiment in a first aspect of the present application provides a contact probe, comprising: a tubular structure within which a receiving cavity is formed, wherein a contact part for contacting a terminal of a first electrical component is provided at a first end of the tubular structure; a spring provided in the receiving cavity, wherein a coil outer diameter of a first end of the spring is greater than a coil outer diameter of a middle of the spring; a plunger connected to the tubular structure in a slidable manner, wherein a first end of the plunger is provided with a spring positioning structure, which comprises a transition part and an eccentric structure body connected to the transition part; wherein the eccentric structure body is arranged offset from a central axis of the plunger, and one end of the eccentric structure body is sheathed by the first end of the spring, an end of the transition part connected to the eccentric structure body is provided with an inclined surface, so that the spring is not contacted with the transition part when the spring is compressed; a second end of the plunger protrudes from a second end of the tubular structure.

The contact probe according to the embodiment of the present application may also have the following technical features.

In some embodiments of the present application, the eccentric structure body is a semi cone or a quasi-semi cone, and the eccentric structure body has a first side surface and a second side surface intersecting with the first side surface, wherein the first side surface is a conical surface and the second side surface is a plane.

In some embodiments of the present application, the quasi-semi cone is a structure formed by cutting off more than ½ volume of a complete cone longitudinally, the second side surface is parallel to a longitudinal section of the plunger, the inclined surface is adjacent to the second side surface, and an angle between the inclined surface and the second side surface is an obtuse angle.

In some embodiments of the present application, an angle between the inclined surface and a horizontal direction is greater than 30°.

In some embodiments of the present application, the angle between the inclined surface and the horizontal direction is 45°.

In some embodiments of the present application, the quasi-semi cone is a structure formed by cutting off more than ½ volume of a complete cone along the inclined surface.

In some embodiments of the present application, the semi cone is a structure formed by cutting off ½ volume of a complete cone longitudinally, the second side surface is coincident with a longitudinal section of the plunger, the inclined surface is adjacent to the second side surface, and an angle between the inclined surface and the second side surface is an obtuse angle.

In some embodiments of the present application, an angle between the inclined surface and a horizontal direction is 50-80°.

In some embodiments of the present application, the angle between the inclined surface and the horizontal direction is 60-70°.

In the embodiment of the present application, the contact probe comprises a tubular structure, a spring, and a plunger, wherein an end of the tubular structure is provided with a contact part for contacting a first electrical component, a receiving cavity is formed within the tubular structure, the spring is provided in the receiving cavity, the plunger is located at the end away from the contact part, and the plunger slidably abuts against the spring. When the contact part abuts against the first electrical component, and the plunger abuts against a second electrical component, an electrical connection can be established between the first electrical component and the second electrical component. When testing the electrical performance of a product, the spring will bend due to compression. In the embodiment of the present application, the coil outer diameter of the first end of the spring is greater than the coil outer diameter of the middle of the spring. Compared to the related art in which the coil outer diameters of both ends of the spring are smaller than the coil outer diameter of the middle of the spring, in the embodiment of the present application, the coil outer diameter of the first end of the spring is increased, such that after the distance between the side wall of the plunger and the inner wall of the tubular structure is enlarged, when the spring is compressed, the first end of the spring will not detach, due to the relatively small coil outer diameter, from the eccentric structure body, and the first end of the spring can maintain a state of sheathing and abutting against the eccentric structure body.

In addition, considering that after the coil outer diameter of the first end of the spring increases, when the spring is compressed, the first end of the spring not only abuts against the spring positioning structure, but also may abut against the transition part, which limits the deformation of the first end of the spring, resulting in a relatively small deformation degree of the spring, then resulting in a relatively small elastic force exerted by the spring on the first end of the plunger, an excessively small acting force between the plunger and the side wall of the tubular structure, and then a relatively small energized load on the contact probe. In this regard, in the embodiment of the present application, an inclined surface is arranged at one end of the transition part connected to the eccentric structure body. By arranging the inclined surface, the spring is not contacted with the transition part when the spring is compressed, thereby providing a relatively large deformation space for the spring. Therefore, during electrical testing, after the spring is compressed, the first end of the spring can undergo a relatively large deformation in the direction of the central axis of the plunger, thereby increasing the elastic force exerted by the spring on the first end of the plunger, thereby increasing the acting force between the plunger and the side wall of the tubular structure, so that the energized contact load of the contact probe reaches an ideal value, thereby improving the reliability of electrical testing. Therefore, the contact probe in the embodiment of the present application can improve the reliability of electrical testing while improving productivity.

An embodiment in a second aspect of the present application provides a contact probe, comprising: a tubular structure within which a receiving cavity is formed, wherein a contact part for contacting a terminal of a first electrical component is provided at a first end of the tubular structure; a spring provided in the receiving cavity, wherein a coil outer diameter of a first end of the spring is greater than a coil outer diameter of a middle of the spring; a plunger connected to the tubular structure in a slidable manner, wherein a first end of the plunger is provided with a spring positioning structure, which is an eccentric structure body arranged offset from a central axis of the plunger, wherein a top end of the eccentric structure body is provided with a contact surface, which is configured to abut against the first end of the spring, and a second end of the plunger protrudes from a second end of the tubular structure.

The contact probe according to the embodiment of the present application may also have the following technical features:

In some embodiments of the present application, the eccentric structure body is a semi cylinder or a quasi-semi cylinder, wherein the quasi-semi cylinder is a structure formed by cutting off more than ½ volume of a complete cylinder longitudinally.

In the embodiment of the present application, the contact probe comprises a tubular structure, a spring, and a plunger, wherein an end of the tubular structure is provided with a contact part for contacting a first electrical component, a receiving cavity is formed within the tubular structure, the spring is provided in the receiving cavity, the plunger is located at the end away from the contact part, and the plunger slidably abuts against the spring. When the contact part abuts against the first electrical component, and the plunger abuts against the second electrical component, an electrical connection can be established between the first electrical component and the second electrical component. When testing the electrical performance of the product, the spring will bend due to compression. In the embodiment of the present application, the coil outer diameter of the first end of the spring is greater than the coil outer diameter of the middle of the spring. Compared to the related art in which the coil outer diameters of both ends of the spring are smaller than the coil outer diameter of the middle of the spring, in the embodiment of the present application, the coil outer diameter of the first end of the spring is increased, such that after the distance between the side wall of the plunger and the inner wall of the tubular structure is enlarged, when the spring is compressed, the first end of the spring will not detach, due to the relatively small coil outer diameter, from the spring positioning structure, and the first end of the spring can remain a state of abutting against the contact surface of the spring positioning structure.

In addition, in the embodiment of the present application, the spring positioning structure is an eccentric structure body arranged offset from the central axis of the plunger. The top end of the eccentric structure body is provided with a contact surface, which is configured to abut against the first end of the spring. Therefore, during electrical testing, after the spring is compressed, the first end of the spring abuts against the contact surface of the eccentric structure body. Due to the height difference between the end face at the first end of the plunger and the contact surface of the eccentric structure body, which provides a relatively large deformation space for the spring. Therefore, after the spring is compressed, the first end of the spring can undergo a relatively large deformation in the direction of the central axis of the plunger, increasing the elastic force exerted by the spring on the first end of the plunger, thereby increasing the acting force between the plunger and the side wall of the tubular structure, so that the energized contact load of the contact probe reaches an ideal value, thereby improving the reliability of electrical testing. Therefore, the contact probe in the embodiment of the present application can improve the reliability of electrical testing while improving productivity.

An embodiment in a third aspect of the present application provides a socket for electrical component testing, comprising: a socket body in which a probe storage hole is provided; the contact probe as described in the first or second aspect, wherein the contact probe is arranged in the probe storage hole.

The socket for electrical component testing in the embodiment of the present application has the contact probe as described in the first or second aspect, and thus also has the beneficial effect of any embodiment of the first or second aspect, which will not be repeated here.

Of course, any product or method implementing the present application does not necessarily require simultaneously achieving all the advantages mentioned above.

BRIEF DESCRIPTION OF THE DRAWINGS

In order to more clearly describe the technical solutions in the embodiments of the present application or the prior art, drawings that need to be used in the embodiments or the prior art will be briefly described below. Obviously, drawings described below are for only some of the embodiments of the present invention. Other embodiments can be obtained by those of ordinary skills in the art according to these drawings.

Figure 1:
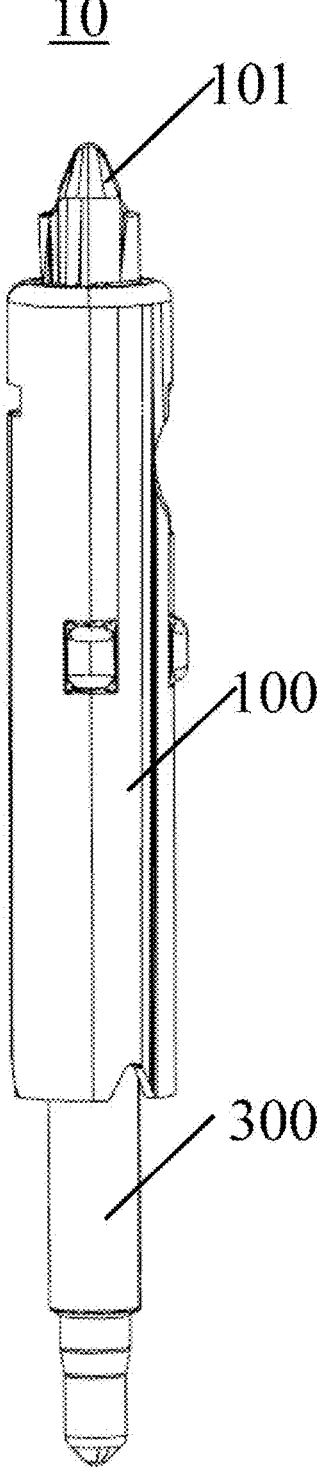
FIG. 1 is a schematic view of a structure of a contact probe in an embodiment of the present application.

In the Figures: contact probe 10; tubular structure 100; contact part 101; receiving cavity 102; spring 200; first end 201; second end 202; plunger 300; spring positioning structure 310; transition part 311; inclined surface 3111; eccentric structure body 312; first side surface 3121; second side surface 3122; contact surface 3123; central axis L.

DETAILED DESCRIPTION

The technical solutions in the embodiments of the present application will be clearly and completely described below with reference to the accompanying drawings in the embodiments of the present application. Obviously, the described embodiments are only some, and not all, of the embodiments of the present invention. All other embodiments obtained based on the present application by those of ordinary skills in the art fall into the scope of protection of the present invention.

As stated in the background above, in the related art, the distance between the side wall of the plunger and the inner wall of the tubular structure is relatively small, which not only imposes higher machining accuracy requirements on the tubular structure and the plunger, but also leads to greater difficulty in assembling the plunger and tubular structure, resulting in lower productivity. In order to improve productivity, the distance between the side wall of the plunger and the inner wall of the tubular structure can be increased. However, it has been verified by the experiments of the inventors that, if the distance between the side wall of the plunger and the inner wall of the tubular structure is increased, during electrical testing, one end of the spring in contact with the plunger is easily separated from the protrusion of the plunger after the spring is compressed, which will reduce the energized contact load of the contact probe and reduce the reliability of electrical testing.

Figure 2:
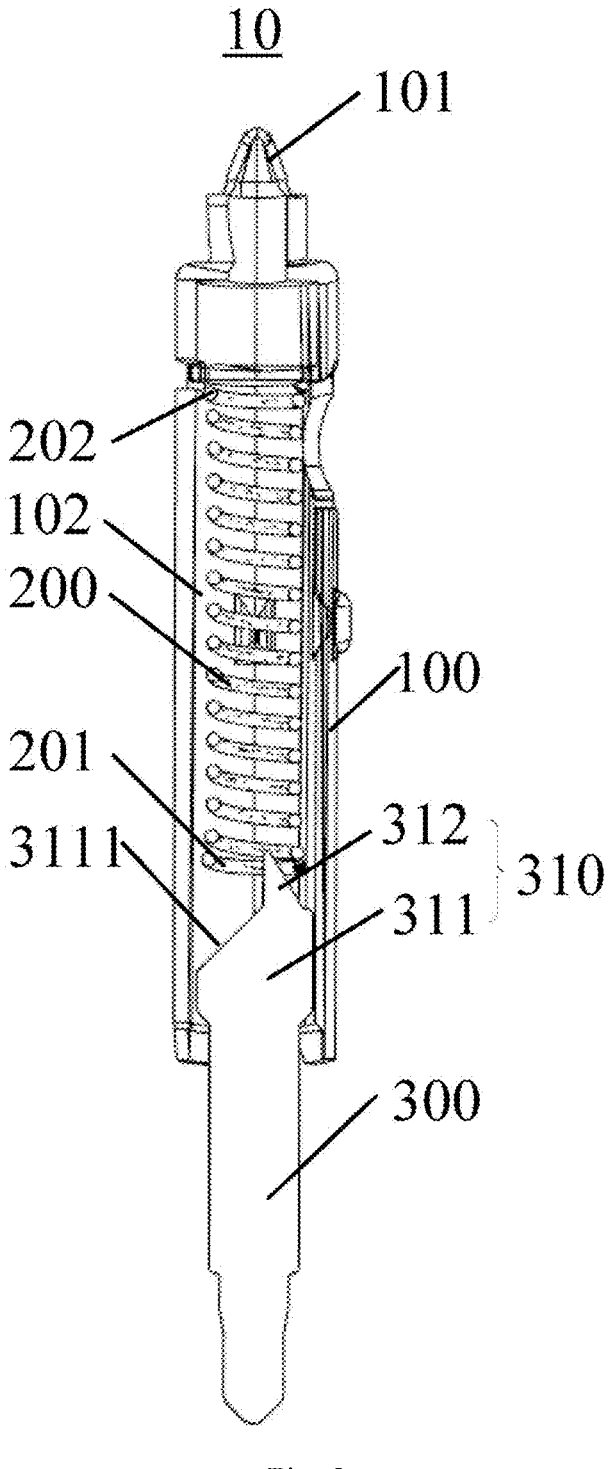
FIG. 2 is a cross-sectional view of a contact probe in a first embodiment in the first aspect of the present application.
Figure 3:
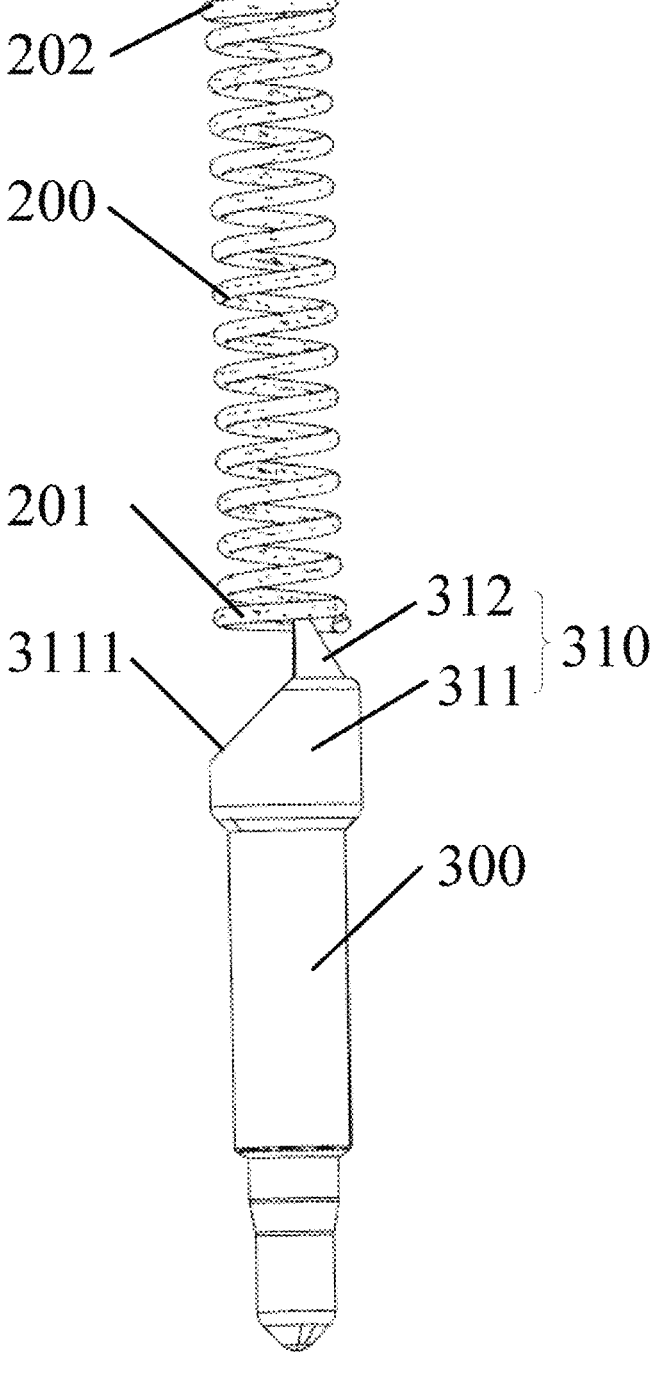
FIG. 3 is a schematic view of a structure of a spring and a plunger in the first embodiment in the first aspect of the present application.
Figure 4:
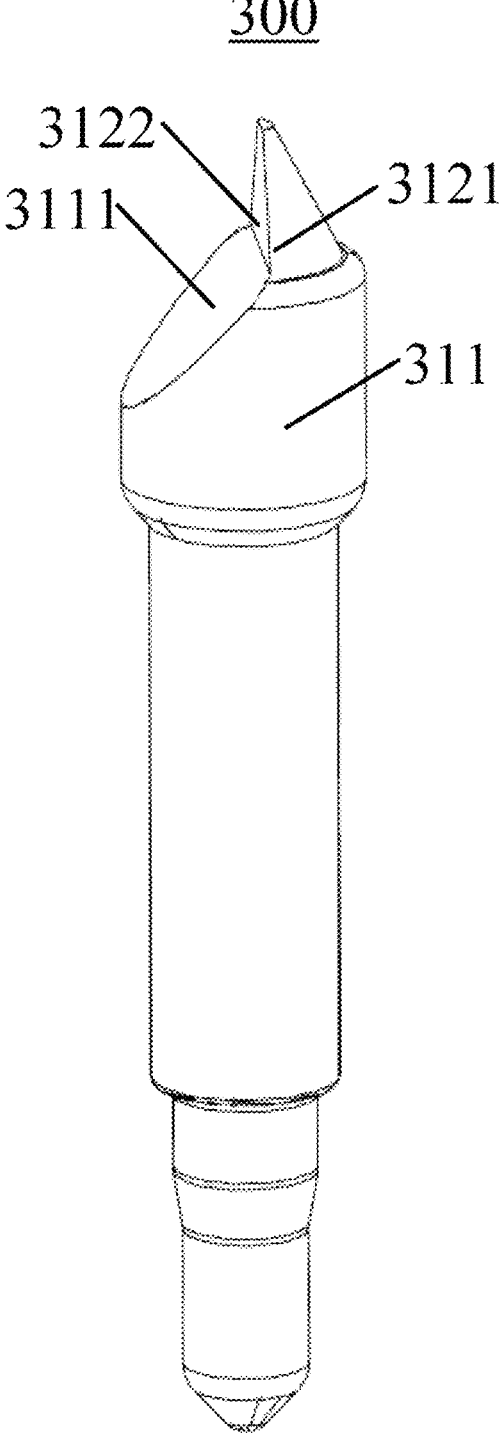
FIG. 4 is a perspective view of the structure of the plunger in the first embodiment in the first aspect of the present application.
Figure 5:
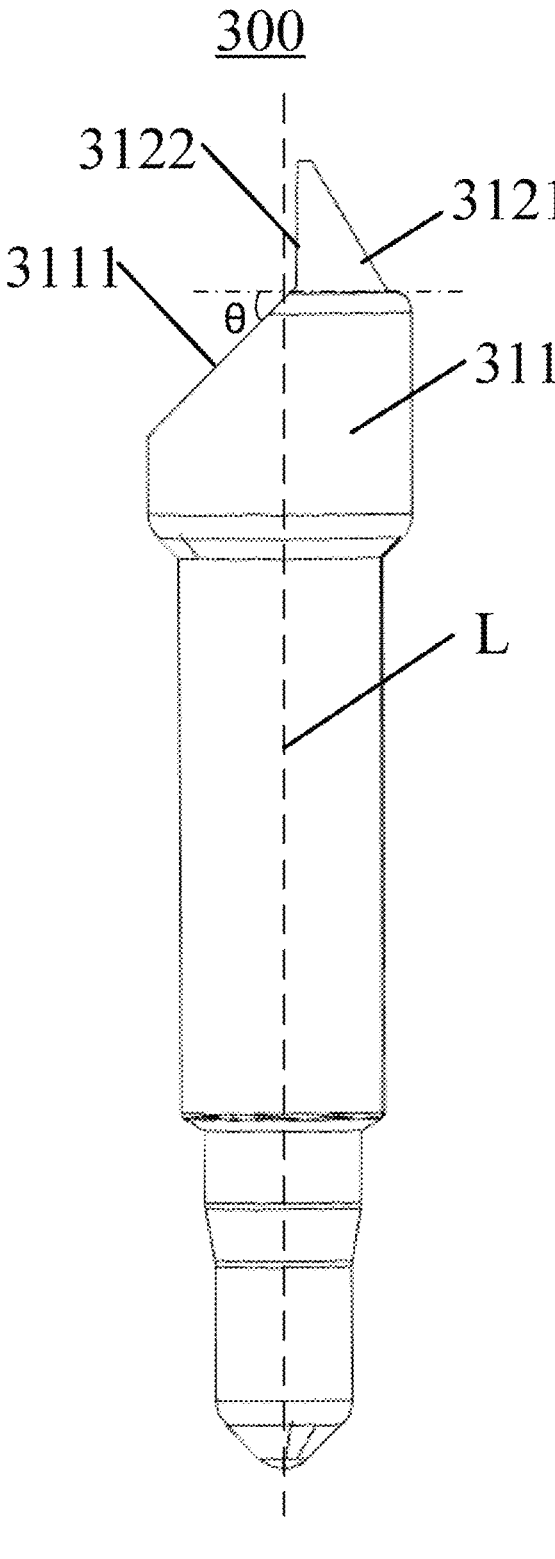
FIG. 5 is a front view of FIG. 4.
Figure 7:
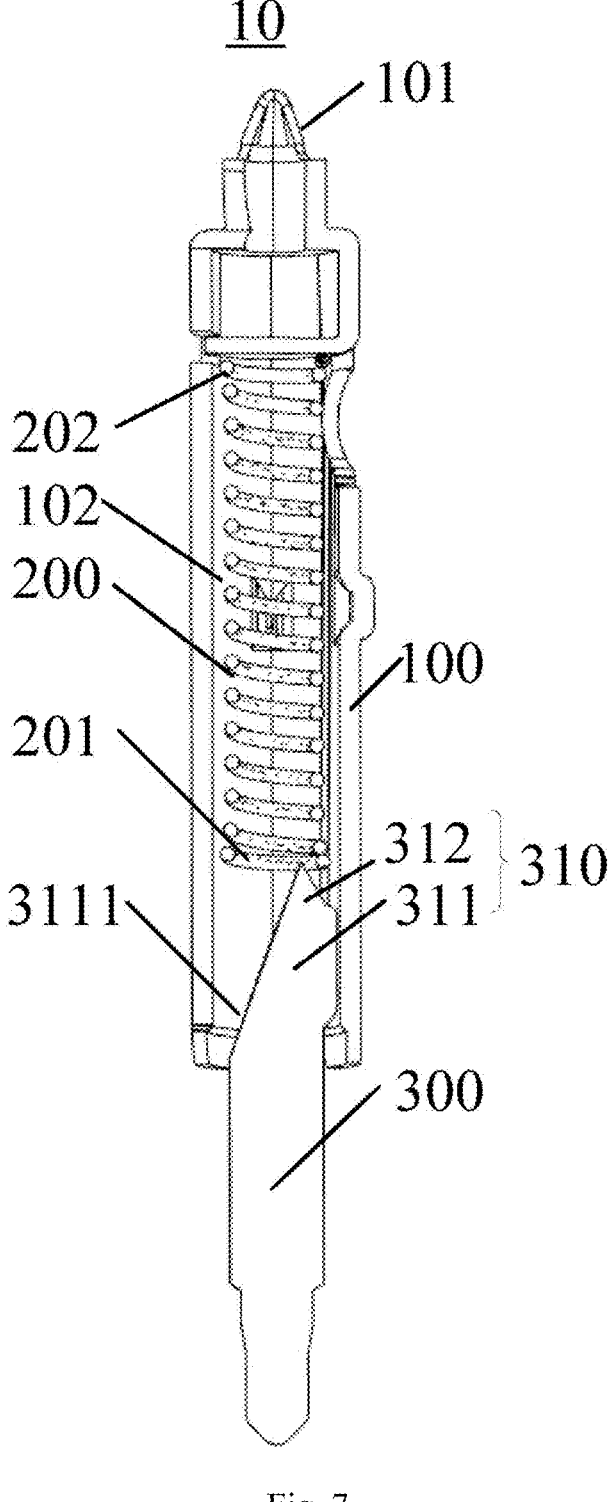
FIG. 7 is a cross-sectional view of a contact probe in a second embodiment in the first aspect of the present application.
Figure 8:
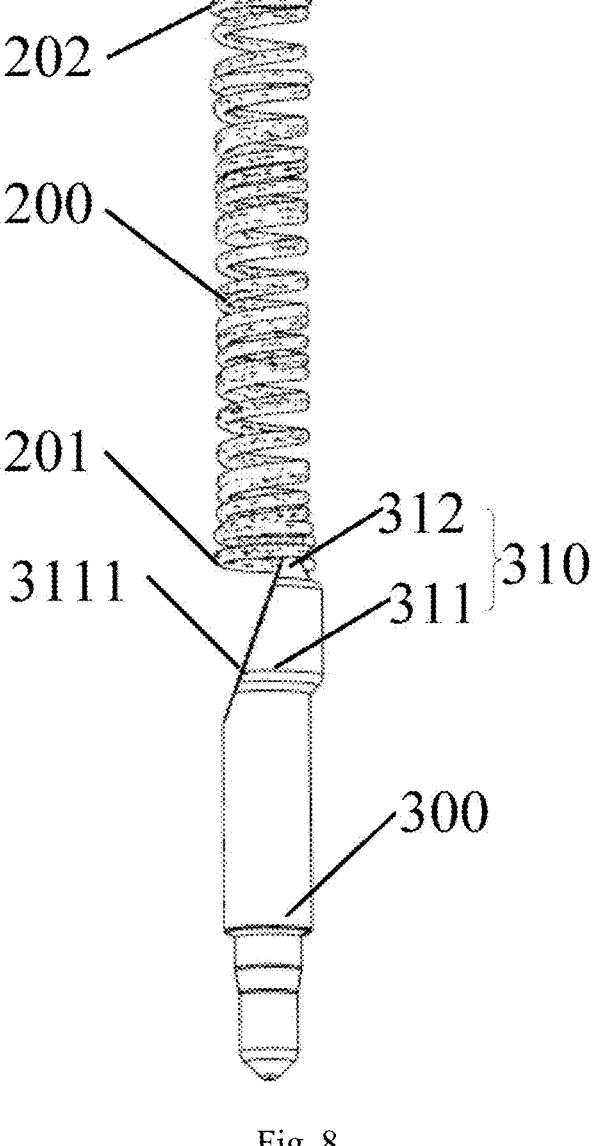
FIG. 8 is a schematic view of a structure of a spring and a plunger in the second embodiment in the first aspect of the present application.
Figure 9:
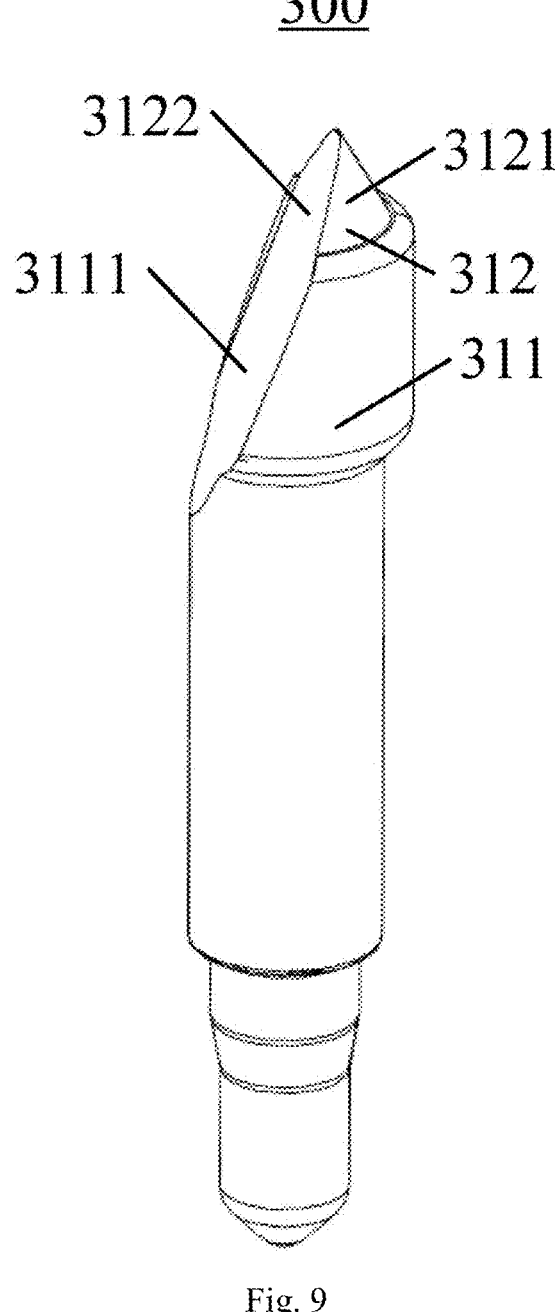
FIG. 9 is a perspective view of the plunger in the second embodiment in the first aspect of the present application.

In view of above, as shown in FIGS. 1, 2 and 7, an embodiment in the first aspect of the present application provides a contact probe 10, comprising a tubular structure 100, a spring 200, and a plunger 300. Wherein, a receiving cavity 102 is formed within the tubular structure 100, and a contact part 101 for contacting a terminal of a first electrical component is provided at the first end of the tubular structure 100. The spring 200 is provided in the receiving cavity 102, and the coil outer diameter of the first end 201 of the spring 200 is greater than the coil outer diameter of the middle of the spring 200. The plunger 300 is connected to the tubular structure 100 in a slidable manner. The first end of the plunger 300 is provided with a spring positioning structure 310, which comprises a transition part 311 and an eccentric structure body 312 connected to the transition part 311. The eccentric structure body 312 is arranged offset from the central axis L of the plunger 300, and one end of the eccentric structure body 312 is sheathed by the first end 201 of the spring 200. One end of the transition part 311 connected to the eccentric structure body 312 is provided with an inclined surface 3111, so that the spring 200 is not contacted with the transition part 311 when the spring 200 is compressed. The second end of the plunger 300 protrudes from the second end of the tubular structure 100.

In the embodiment of the present application, the contact probe 10 comprises a tubular structure 100, a spring 200, and a plunger 300, wherein a contact part 101 for contacting a first electrical component is provided at one end of the tubular structure 100, a receiving cavity 102 is formed within the tubular structure 100, the spring 200 is provided in the receiving cavity 102, the plunger 300 is located at one end away from the contact part 101, and the plunger 300 slidably abuts against the spring 200. When the contact part 101 abuts against the first electrical component, and the plunger 300 abuts against the second electrical component, an electrical connection can be established between the first electrical component and the second electrical component. When testing the electrical performance of a product, the spring 200 will bend due to compression. In the embodiment of the present application, the coil outer diameter of the first end of the spring 200 is greater than the coil outer diameter of the middle of the spring 200. Compared to the related art in which the coil outer diameters of both ends of the spring 200 are smaller than the coil outer diameter of the middle of the spring 200, in the embodiment of the present application, the coil outer diameter of the first end 201 of the spring 200 is increased, such that after the distance between the side wall of the plunger 300 and the inner wall of the tubular structure 100 is enlarged, when the spring 200 is compressed, the first end 201 of the spring 200 will not detach, due to the relatively small coil outer diameter, from the eccentric structure body 312, and the first end 201 of the spring 200 can maintain a state of sheathing and abutting against the eccentric structure body 312.

In addition, considering that after the coil outer diameter of the first end 201 of the spring increases, when the spring 200 is compressed, the first end 201 of the spring 200 not only abuts against the spring positioning structure 310, but also may abut against the transition part 311, which limits the deformation of the first end 201 of the spring, resulting in a relatively small deformation degree of the spring 200, and thus resulting in a relatively small elastic force exerted by the spring 200 on the first end of the plunger 300, an excessively small acting force between the plunger 300 and the side wall of the tubular structure 100, and then a relatively small energized load on the contact probe. In this regard, in the embodiment of the present application, an inclined surface 3111 is arranged at one end of the transition part 311 connected to the eccentric structure body 312. By arranging the inclined surface 3111, the spring 200 is not contacted with the transition part 311 when the spring 200 is compressed, thereby providing a relatively large deformation space for the spring 200. Therefore, during electrical testing, after the spring 200 is compressed, the first end 201 of the spring 200 may undergo a relatively large deformation in the direction of the central axis L of the plunger 300, thereby increasing the elastic force exerted by the spring 200 on the first end of the plunger 300, thereby increasing the acting force between the plunger 300 and the side wall of the tubular structure 100, so that the energized contact load of the contact probe 10 reaches an ideal value, thereby improving the reliability of electrical testing. Therefore, the contact probe 10 in the embodiment of the present application can improve the reliability of electrical testing while improving productivity.

It should be noted that the energized contact load of the contact probe 10 refers to the acting force exerted by the plunger 300 on the side wall of the tubular structure 100 when an electrical connection is established between a first electrical component and a second electrical component through the contact probe 10. The value of the energized contact load is related to the reliability of electrical testing. Specifically, in order to ensure the accuracy of results of the electrical testings, the resistance value of the contact probe 10 is not allowed to exceed an allowable resistance value. According to the different loads applied to the second electrical component by the contact probe 10 in operation, the contact probe 10 can be classified into various types. The inventors of the present application have found that for the contact probes 10 of types with relatively small loads, the resistance values thereof will increase with the increase of the number of electrical testings. This means that as the number of electrical testings increases, the contact probes 10 of the types with relatively small loads will frequently have resistance values exceeding the allowable resistance value, which will have an adverse impact on the accuracy of results of the electrical testing and thus reduce the reliability of electrical testing. In this regard, the inventors of the present application have conducted extensive research and verification by experiments, and found that the resistance value of the contact probe 10 is correlated with the energized contact load of the contact probe 10. When the energized contact load is greater than a certain value, even if the number of electrical testings has reached a large value, there will be no occurrence of the resistance value of the contact probe 10 exceeding the allowable resistance value. Therefore, by increasing the energized contact load, it is possible to reduce the occurrence of the resistance value of the contact probe 10 exceeding the allowable resistance value, thereby improving the reliability of electrical testing.

It should be noted that the end of the spring 200 near the plunger 300 is the first end 201 of the spring 200, and the end of the spring 200 near the contact part 101 is the second end 202 of the spring 200. The coil outer diameter of at least the first end 201 of the spring 200 is greater than the coil outer diameter of the middle of the spring 200, and the coil outer diameter of the second end 202 of the spring 200 may also be greater than the coil outer diameter of the middle of the spring 200.

It can be understood that in the embodiment of the present application, a contact part 101 for contacting a terminal of the first electrical component is provided at the first end of the tubular structure 100. The contact part 101 may be integrally formed with the first end of the tubular structure 100, or may be a separate structure independent of the tubular structure 100, which is not limited in the present application.

As shown in FIGS. 4, 5, 9 and 10, in some embodiments of the present application, the eccentric structure body 312 is a semi cone or a quasi-semi cone, and the eccentric structure body 312 has a first side surface 3121 and a second side surface 3122 intersecting with the first side surface 3121, wherein the first side surface 3121 is a conical surface and the second side surface 3122 is a plane.

By arranging the eccentric structure body 312 as a semi cone or a quasi-semi cone, the first end 201 of the spring 200 can sheath and abut against the eccentric structure body 312 after the compression of the spring 200. Due to the eccentric structure body 312 being arranged offset from the central axis L of the plunger 300, the spring 200 can undergo significant bending after compression. The bending of the spring 200 causes a portion of the spring 200 to closely abut against the inner wall of the tubular structure 100, thereby increasing the energized contact load of the contact probe 10 and reducing the occurrence of the resistance value of the contact probe 10 exceeding the allowable resistance value, thereby improving the reliability of electrical testing.

As shown in FIGS. 2-5, in the first embodiment of the present application, the quasi-semi cone is a structure formed by cutting off more than ½ volume of a complete cone longitudinally, wherein the second side surface 3122 is parallel to the longitudinal section of the plunger 300, the inclined surface 3111 is adjacent to the second side surface 3122, and the angle between the inclined surface 3111 and the second side 3122 is an obtuse angle. By arranging the eccentric structure body 312 as a quasi-semi cone, a relatively large deformation space can be provided for the spring 200, allowing the spring 200 to have a relatively large deformation degree after compression, which leads to a relatively large elastic force of the spring 200 and thus increases the acting force between the plunger 300 and the side wall of the tubular structure 100, so that the energized contact load of the contact probe 10 reaches an ideal value, improving the reliability of electrical testing. It can be understood that in the embodiment of the present application, the inclined surface 3111 extends from the end face at the end of the transition part 311 contacted with the eccentric structure body 312 in a direction away from the spring 200 to the side surface of the transition part 311.

In some embodiments of the present application, the angle θ between the inclined surface 3111 and a horizontal direction is greater than 30°. By setting the angle between the inclined surface 3111 and the horizontal direction to be greater than 30°, it is possible to avoid the contact between the first end 201 of the spring 200 and the transition part 311, allowing the spring 200 to have a relatively large deformation space in the direction of the central axis L of the plunger 300.

Figures 6A, 6B:
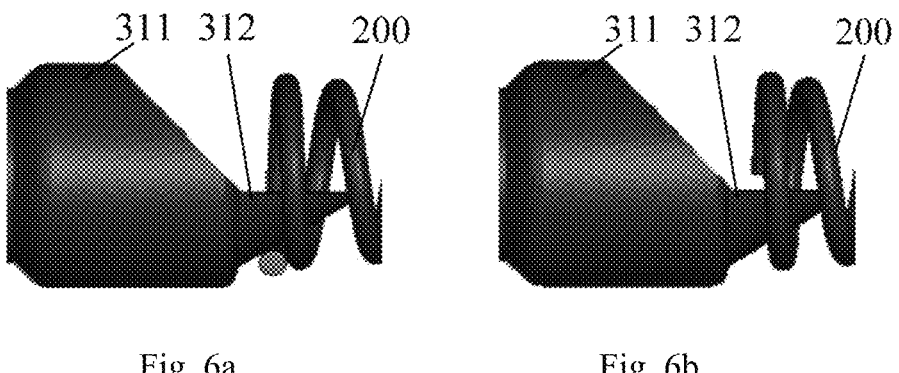
FIG. 6a is a schematic view illustrating the spring in a standard position in the first embodiment in the first aspect of the present application.
FIG. 6b is a schematic view illustrating the position of the spring after a rotation of 90° relative to the standard position in the first embodiment in the first aspect of the present application.
Figures 6C, 6D:
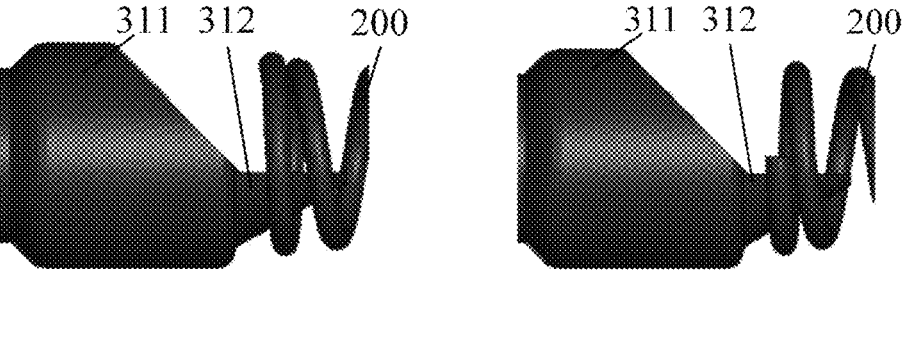
FIG. 6c is a schematic view illustrating the position of the spring after a rotation of 180° relative to the standard position in the first embodiment in the first aspect of the present application.
FIG. 6d is a schematic view illustrating the position of the spring after a rotation of 270° relative to the standard position in the first embodiment in the first aspect of the present application.

In some embodiments of the present application, the angle between the inclined surface 3111 and the horizontal direction is 45°. It has been verified through experiments by the inventors that, when the angle between the inclined surface 3111 and the horizontal direction is 45°, the energized contact load of the contact probe 10 is large enough after the compression of the spring 200. In addition, considering that the spring 200 may rotate in the receiving cavity 102, causing a change in the initial position of the spring 200 before compression, as shown in FIGS. 6a to 6d, the inventors also conducted experiments by rotating the initial position of the spring 200 by 90°, 180°, and 270° relative to a standard position, respectively. FIG. 6a is a schematic diagram illustrating the position of the spring 200 relative to the plunger 300 when the initial position of the spring 200 is the standard position, FIG. 6b is a schematic diagram illustrating the position of the spring 200 relative to the plunger 300 when the initial position of the spring 200 is rotated by 90° relative to the standard position, FIG. 6c is a schematic diagram illustrating the position of the spring 200 relative to the plunger 300 when the initial position of the spring 200 is rotated by 180° relative to the standard position, and FIG. 6d is a schematic diagram illustrating the position of the spring 200 relative to plunger 300 when the initial position of the spring 200 is rotated by 270° relative to the standard position. It is verified that the energized contact load of the contact probe 10 is large enough when the initial position of the spring 200 is located at four different positions respectively, i.e. the standard position, and positions after rotations of 90°, 180°, and 270° relative to the standard position. That is, when the angle between the inclined surface 3111 and the horizontal direction is 45°, even if the initial position of the spring 200 changes, the energized contact load of the contact probe 10 is still large enough after the compression of the spring 200.

In some other embodiments of the present application, the angle between the inclined surface 3111 and the horizontal direction is 40° or 50°.

As shown in FIGS. 7-10, in the second embodiment of the present application, the quasi-semi cone is a structure formed by cutting off more than ½ volume of a complete cone along the inclined surface 3111. Thus, a relative large deformation space can be provided for the spring 200, allowing the spring 200 to have a relative large deformation degree after compression, which leads to a relative large elastic force of the spring 200 and thus increases the energized contact load between the plunger 300 and the side wall of the tubular structure 100 to an ideal value, thereby improving the reliability of electrical testing. In addition, a quasi-semi cone being a structure formed by cutting off more than ½ volume of a complete cone along the inclined surface 3111 facilitates the production of the quasi-semi cone. It can be understood that since a quasi-semi cone is a structure formed by cutting off more than ½ volume of a complete cone along the inclined surface 3111, the second side surface 3122 of the eccentric structure body 312 is located in the same plane as the inclined surface 3111.

In some embodiments of the present application, the angle θ between the inclined surface 3111 and the horizontal direction is 50°-80°. Thus, it is possible to avoid contact between the first end 201 of the spring 200 and the transition part 311, allowing the spring 200 to have a relative large deformation space in the direction of the central axis L of the plunger 300.

In some embodiments of the present application, the angle θ between the inclined surface 3111 and the horizontal direction is 60°-70°. It has been verified through experiments by the inventors that, when the angle between the inclined surface 3111 and the horizontal direction is 60°-70°, the energized contact load of the contact probe 10 can reach an ideal value after the compression of the spring 200.

Figure 10:
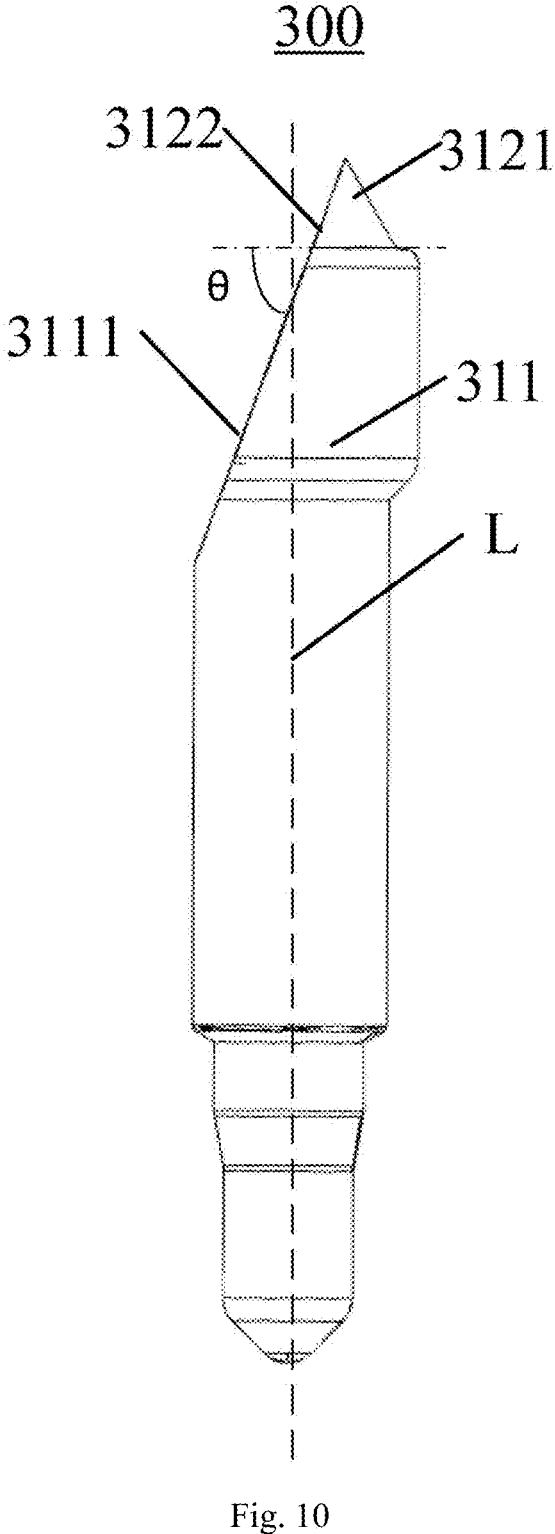
FIG. 10 is a front view of FIG. 9.

In one preferred embodiment, as shown in FIG. 10, the angle θ between the inclined surface 3111 and the horizontal direction is 70°. It has been verified through experiments by the inventors that, when the angle between the inclined surface 3111 and the horizontal direction is 70°, the results of the tested energized contact load are more stable after the compression of the spring 200. Considering that the spring 200 may rotate in the receiving cavity 102, causing a change in the initial position of the spring 200 before compression, the inventors also conducted experiments by rotating the initial position of the spring 200 by 90°, 180°, and 270° relative to the standard position, respectively. The experimental results show that when the angle between the inclined surface 3111 and the horizontal direction is 70°, even if the initial position of the spring 200 changes, after the compression of the spring 200, the energized contact load of the contact probe 10 is still greater than 40 mN.

In some other embodiments of the present application, the angle θ between the inclined surface 3111 and the horizontal direction is 60° or 65°.

Figure 11:
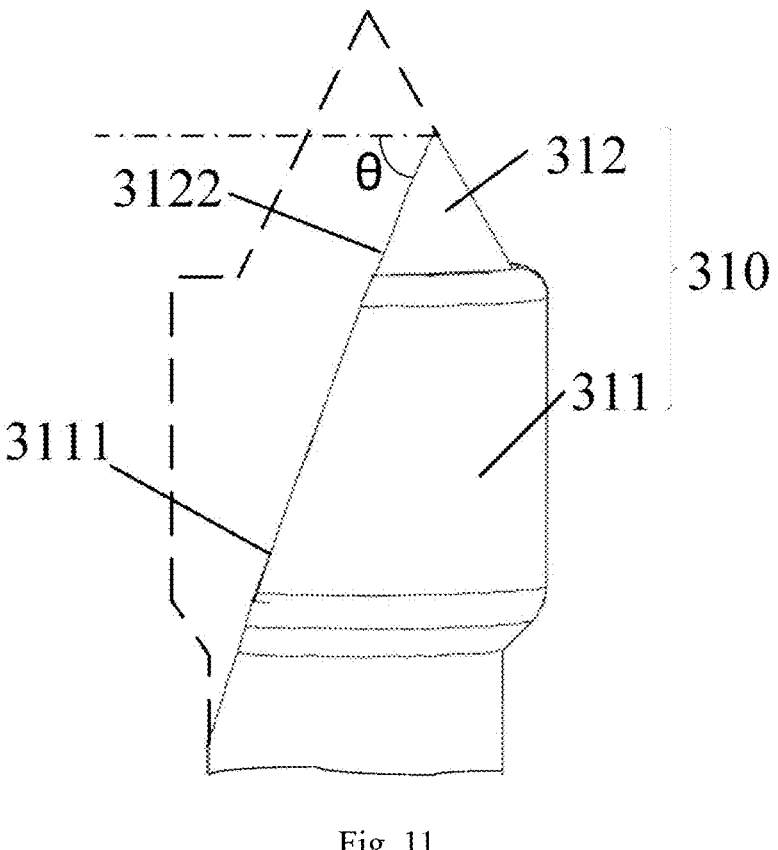
FIG. 11 is a schematic view illustrating the production of the plunger in the second embodiment in the first aspect of the present application.
Figure 12:
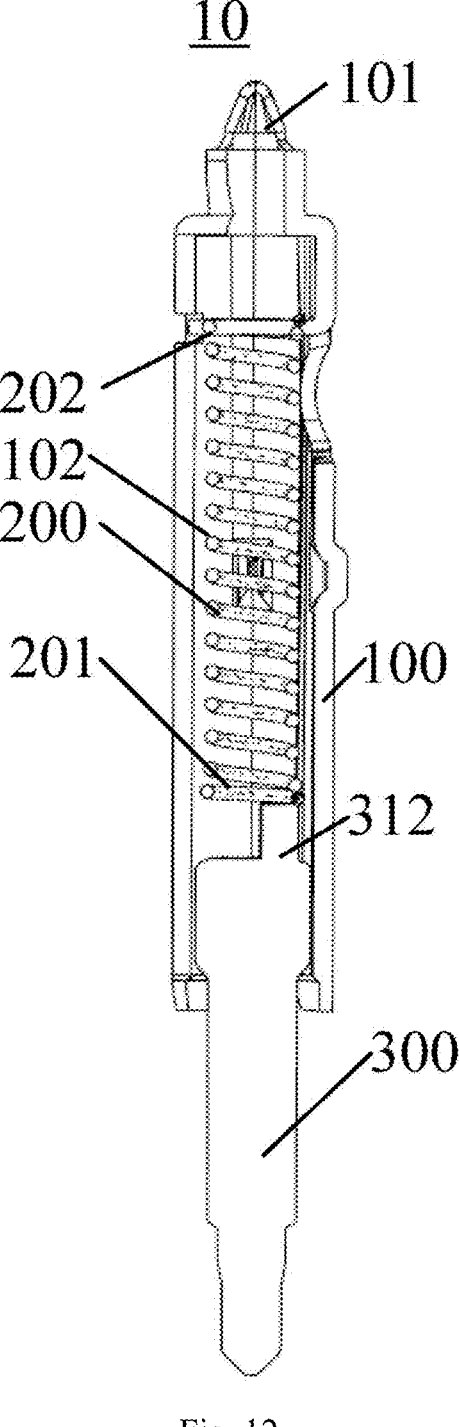
FIG. 12 is a cross-sectional view of a contact probe in a first embodiment in the second aspect of the present application.
Figure 13:
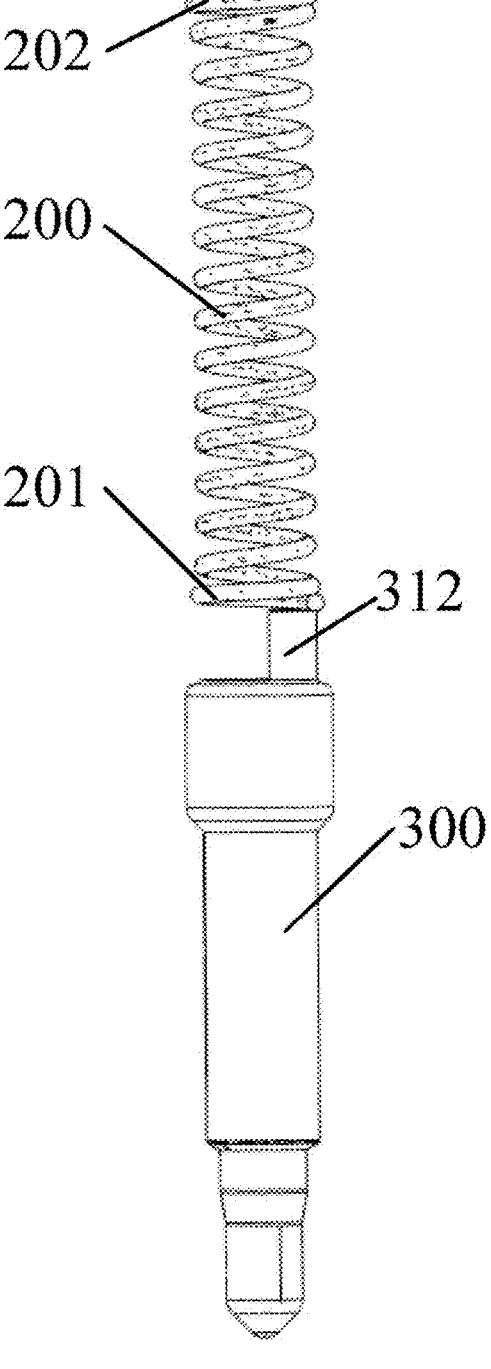
FIG. 13 is a schematic view of a structure of a spring and a plunger in the first embodiment in the second aspect of the present application.
Figure 14:
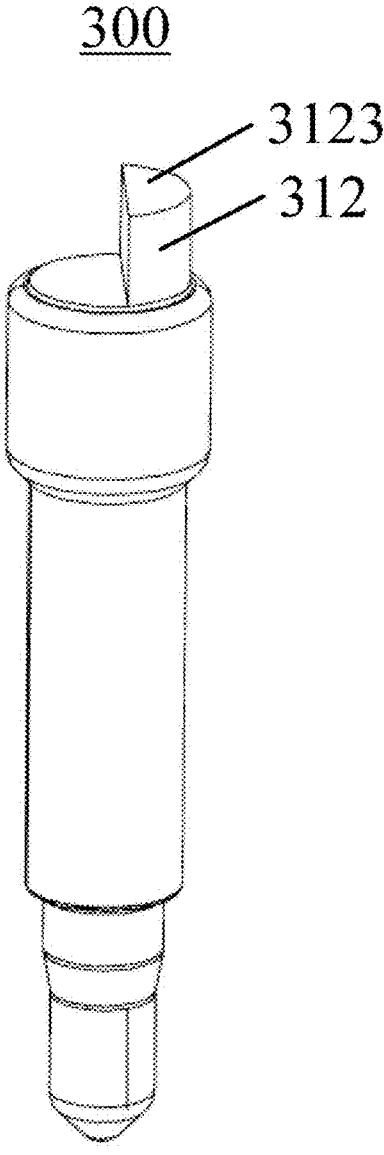
FIG. 14 is a perspective view of the structure of the plunger in the first embodiment in the second aspect of the present application.

In one embodiment of the present application, the producing method of the spring positioning structure 310 is shown in FIG. 11. The first end of the plunger 300 is first processed into a complete cylindrical structure, and the end face of the cylindrical structure is processed to have one complete cone, and then parts of the cylindrical structure and the cone are cut off along the direction having an angle θ with the horizontal plane, to obtain the spring positioning structure 310 in the embodiment of the present application, wherein the remaining part of the cylindrical structure after cutting is the transition part 311, and the exposed plane after cutting is the inclined surface 3111; the volume of the part that is cut off from the cone is greater than ½ of the volume of the cone, and the remaining part of the cone after cutting is an eccentric structure body 312. The exposed plane after cutting is the second plane 3122.

In some other embodiments of the present application, the semi cone is a structure formed by cutting off ½ volume of a complete cone longitudinally, the second side surface 3122 is coincident with the longitudinal section of the plunger 300, the inclined surface 3111 is adjacent to the second side surface 3122, and the angle between the inclined surface 3111 and the second side surface 3122 is an obtuse angle. In the embodiment of the present application, the eccentric structure body 312 is a semi cone, which not only facilitates the processing of the eccentric structure body 312, but also allows the first end 201 of the spring 200 to sheath and abut against the eccentric structure body 312 after the compression of the spring 200, thereby making the spring 200 in a obviously bent state.

As shown in FIGS. 12-15, an embodiment in the second aspect of the present application provides a contact probe 10, comprising: a tubular structure 100 within which a receiving cavity 102 is formed, wherein a contact part 101 for con-
tacting a terminal of a first electrical component is arranged
at the first end of the tubular structure 100; a spring 200
arranged in the receiving cavity 102, wherein the coil outer
diameter of the first end 201 of the spring 200 is greater than
the coil outer diameter of the middle of the spring 200; a
plunger 300 connected to the tubular structure 100 in a
slidable manner, wherein the first end of the plunger 300 is
provided with a spring positioning structure 310, which is an
eccentric structure body 312 arranged offset from the central
axis L of the plunger 300, the top end of the eccentric
structure body 312 is provided with a contact surface 3123,
which is configured to abut against the first end 201 of the
spring 200, and the second end of the plunger 300 protrudes
from the second end of the tubular structure 100.

In the embodiment of the present application, the contact
probe 10 comprises a tubular structure 100, a spring 200, and
a plunger 300, wherein a contact part 101 for contacting the
first electrical component is provided at one end of the
tubular structure 100, a receiving cavity 102 is formed
within the tubular structure 100, the spring 200 is provided
within the receiving cavity 102, the plunger 300 is located
at one end away from the contact part 101, and the plunger
300 slidably abuts against the spring 200. When the contact
part 101 abuts against the first electrical component, and the
plunger 300 abuts against the second electrical component,
an electrical connection can be established between the first
electrical component and the second electrical component.
When testing the electrical performance of a product, the
spring 200 will bend due to compression. In the embodiment
of the present application, the coil outer diameter of the first
end 201 of the spring 200 is greater than the coil outer
diameter of the middle of the spring 200. Compared to the
related art in which the coil outer diameters of both ends of
the spring 200 are smaller than the coil outer diameter of the
middle of the spring 200, in the embodiment of the present
application, the coil outer diameter of the first end 201 of the
spring 200 is increased, such that after the distance between
the side wall of the plunger 300 and the inner wall of the
tubular structure 100 is enlarged, when the spring 200 is
compressed, the first end 201 of the spring 200 will not
detach, due to the relatively small coil outer diameter, from
the spring positioning structure 310, and the first end 201 of
the spring 200 can remain a state of abutting against the
contact surface 3123 of the spring positioning structure 310.

In addition, in the embodiment of the present application,
the spring positioning structure 310 is an eccentric structure
body 312 arranged offset from the central axis L of the
plunger 300. The top end of the eccentric structure body 312
is provided with a contact surface 3123, which is configured
to abut against the first end 201 of the spring 200. Therefore,
during electrical testing, after the spring 200 is compressed,
the first end 201 of the spring abuts against the contact
surface 3123 of the eccentric structure body 312. Due to a
height difference between the end face at the first end of the
plunger 300 and the contact surface 3123 of the eccentric
structure body 312, a relatively large deformation space can
be provided for the spring 200. Therefore, after the spring
200 is compressed, the first end 201 of the spring 200 can
undergo a relatively large deformation in the direction of the
central axis L of the plunger 300, increasing the elastic force
exerted by the spring 200 on the first end of the plunger 300,
thereby increasing the acting force between the plunger 300
and the side wall of the tubular structure 100, so that the
energized contact load of the contact probe 10 reaches an
ideal value, thereby improving the reliability of electrical
testing. Therefore, the contact probe 10 in the embodiment of the present application can improve the reliability of
electrical testing while improving productivity.

It can be understood that in the embodiment of the present
application, a contact part 101 for contacting a terminal of
a first electrical component is provided at the first end of the
tubular structure 100. The contact part 101 may be integrally
formed with the first end of the tubular structure 100 or may
be a separate structure independent of the tubular structure
100, which is not limited in the present application.

In some embodiments of the present application, the
eccentric structure body 312 is a semi cylinder or a quasi-
semi cylinder, wherein the quasi-semi cylinder is a structure
formed by cutting off more than ½ volume of a complete
cylinder longitudinally. By arranging the eccentric structure
body 312 as a semi cylinder or a quasi-semi cylinder, the
first end 201 of the spring 200 can abut against the eccentric
structure body 312 after the compression of the spring 200.
Due to the eccentric structure body 312 being arranged offset
from the central axis L of the plunger 300, the spring 200 can
undergo significant bending after compression. The bending
of the spring 200 causes a part of the spring 200 to closely
abut against the inner wall of the tubular structure 100,
thereby increasing the energized contact load of the contact
probe 10 and reducing the occurrence of the resistance value
of the contact probe 10 exceeding an allowable resistance
value, thereby improving the reliability of electrical testing.

Figure 15:
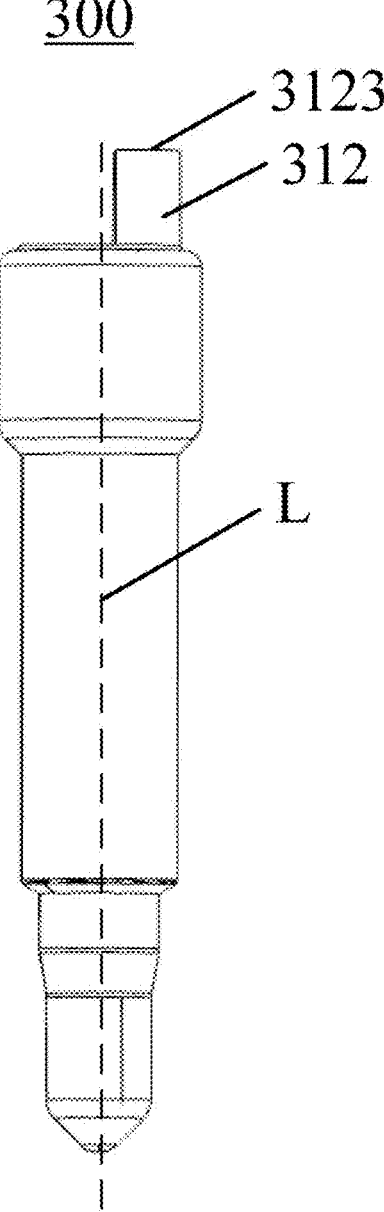
FIG. 15 is a front view of FIG. 14.

As shown in FIG. 15, in the first embodiment of the
present application, the eccentric structure body 312 is a
quasi-semi cylinder. It has been verified by the experiments
of the inventors that, when the eccentric structure body 312
is arranged as a quasi-semi cylinder, during electrical test-
ing, the energized contact load of the contact probe 10 is
large enough after the compression of the spring 200.
Additionally, considering that the spring 200 may rotate in
the receiving cavity 102, causing a change in the initial
position of the spring 200 before compression, the inventors
also conducted experiments by rotating the initial position of
the spring 200 by 90°, 180°, and 270° relative to a standard
position, respectively. The experimental results show that
when the eccentric structure body 312 is a quasi-semi
cylinder, even if the initial position of the spring 200
changes, the energized contact load of the contact probe 10
is still large enough after the compression of the spring 200.

The embodiment in the third aspect of the present appli-
cation provides a socket for electrical component testing,
comprising a socket body on which a probe storage hole is
provided; the contact probe 10 as described in the first or
second aspect, wherein the contact probe 10 is arranged in
the probe storage hole.

The socket for electrical component testing in the embodi-
ment of the present application has a contact probe 10 as
described in the first or second aspect, and thus also has the
beneficial effect of any embodiment in the first or second
aspect, which will not be repeated here.

It should be noted that in this article, relational terms such
as first and second are only to distinguish one entity or
operation from another entity or operation, and do not
necessarily require or imply any actual relationship or order
between these entities or operations. Moreover, the terms
"comprise", "contain", or any other variation thereof are
intended to encompass non-exclusive inclusion, such that a
process, method, item, or device that comprises a series of
elements comprises not only those elements, but also other
elements that are not explicitly listed, or also comprise
elements inherent in such a process, method, item, or device.
Without further limitations, the elements limited by the
statement "comprising one . . . " do not exclude the existence of other identical elements in the process, method, item, or device that comprises the elements.

Each embodiment of the present description is described in a relevant manner, and the same and similar parts of each embodiment can be referred to each other, and each embodiment focuses on the differences from other embodiment. In particular, for the embodiments of the system, since they are basically similar to the embodiments of the method, the description thereof is relatively simple. Please refer to the partial description of the embodiments of the method for details.

The above is only a preferred embodiment of the present invention and is not intended to limit the scope of protection of the present invention. Any modification, equivalent replacement, improvement, etc. made within the spirit and principles of this invention shall be included in the scope of protection of this invention.

What is claimed is:

1. A contact probe, comprising:
a tubular structure within which a receiving cavity is formed, wherein a contact part for contacting a terminal of a first electrical component is provided at a first end of the tubular structure;
a spring provided in the receiving cavity, wherein a coil outer diameter of a first end of the spring is greater than a coil outer diameter of a middle of the spring;
a plunger connected to the tubular structure in a slidable manner, wherein a first end of the plunger is provided with a spring positioning structure, which comprises a transition part and an eccentric structure body connected to the transition part; wherein the eccentric structure body is arranged offset from a central axis of the plunger, and one end of the eccentric structure body is sheathed by the first end of the spring, an end of the transition part connected to the eccentric structure body is provided with an inclined surface, so that the spring is not contacted with the transition part when the spring is compressed; a second end of the plunger protrudes from a second end of the tubular structure.

2. The contact probe according to claim 1, wherein the eccentric structure body is a semi cone or a quasi-semi cone, and the eccentric structure body has a first side surface and a second side surface intersecting with the first side surface, wherein the first side surface is a conical surface and the second side surface is a plane.

3. The contact probe according to claim 2, wherein the quasi-semi cone is a structure formed by cutting off more than ½ volume of a complete cone longitudinally, the second side surface is parallel to a longitudinal section of the plunger, the inclined surface is adjacent to the second side surface, and an angle between the inclined surface and the second side surface is an obtuse angle.

4. The contact probe according to claim 3, wherein an angle between the inclined surface and a horizontal direction is greater than 30°.

5. The contact probe according to claim 4, wherein the angle between the inclined surface and the horizontal direction is 45°.

6. The contact probe according to claim 2, wherein the quasi-semi cone is a structure formed by cutting off more than ½ volume of a complete cone along the inclined surface.

7. The contact probe according to claim 6, wherein an angle between the inclined surface and a horizontal direction is 50-80°.

8. The contact probe according to claim 7, wherein the angle between the inclined surface and the horizontal direction is 60-70°.

9. The contact probe according to claim 2, wherein the semi cone is a structure formed by cutting off ½ volume of a complete cone longitudinally, the second side surface is coincident with a longitudinal section of the plunger, the inclined surface is adjacent to the second side surface, and an angle between the inclined surface and the second side surface is an obtuse angle.

10. A socket for electrical component testing, comprising:
a socket body on which a probe storage hole is provided;
the contact probe according to claim 1, wherein the contact probe is provided in the probe storage hole.

11. A contact probe, comprising:
a tubular structure within which a receiving cavity is formed, wherein a contact part for contacting a terminal of a first electrical component is provided at a first end of the tubular structure;
a spring provided in the receiving cavity, wherein a coil outer diameter of a first end of the spring is greater than a coil outer diameter of a middle of the spring;
a plunger connected to the tubular structure in a slidable manner, wherein a first end of the plunger is provided with a spring positioning structure, which is an eccentric structure body arranged offset from a central axis of the plunger, wherein a top end of the eccentric structure body is provided with a contact surface, which is configured to abut against the first end of the spring, and a second end of the plunger protrudes from a second end of the tubular structure.

12. The contact probe according to claim 11, wherein the eccentric structure body is a semi cylinder or a quasi-semi cylinder, wherein the quasi-semi cylinder is a structure formed by cutting off more than ½ volume of a complete cylinder longitudinally.

* * * * *